(12) United States Patent
Liu et al.

(10) Patent No.: US 10,937,904 B2
(45) Date of Patent: Mar. 2, 2021

(54) PROGRAMMABLE CHARGE-STORAGE TRANSISTOR, AN ARRAY OF ELEVATIONALLY-EXTENDING STRINGS OF MEMORY CELLS, AND A METHOD OF FORMING AN ARRAY OF ELEVATIONALLY-EXTENDING STRINGS OF MEMORY CELLS

(71) Applicant: Micron Technology, Inc., Boise, ID (US)

(72) Inventors: Haitao Liu, Boise, ID (US); Kamal M. Karda, Boise, ID (US); Albert Fayrushin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/890,530

(22) Filed: Feb. 7, 2018

(65) Prior Publication Data
US 2019/0198673 A1    Jun. 27, 2019

Related U.S. Application Data

(60) Provisional application No. 62/610,846, filed on Dec. 27, 2017.

(51) Int. Cl.
*H01L 29/78* (2006.01)
*H01L 29/423* (2006.01)
(Continued)

(52) U.S. Cl.
CPC .... *H01L 29/78391* (2014.09); *H01L 27/1157* (2013.01); *H01L 27/1159* (2013.01);
(Continued)

(58) Field of Classification Search
CPC ......... H01L 29/78391; H01L 29/42324; H01L 29/4234; H01L 29/512; H01L 29/513;
(Continued)

(56) References Cited

U.S. PATENT DOCUMENTS 8,796,656 B2    8/2014    Ramaswamy et al.
9,455,261 B1 *   9/2016    Sun ...................... H01L 27/115
(Continued)

OTHER PUBLICATIONS

Kobayashi, et al. "Device Design Guidelines for Steep Slope Ferroelectric FET Using Negative Capacitance in Sub-0.2V Operation: Operation Speed, Material Requirement and Energy Efficiency" IEEE, 2015 Symposiuim on VLSI Technology, Jun. 16-18, 2015, United States, 2 pages.
(Continued)

*Primary Examiner* — Christine A Enad
(74) *Attorney, Agent, or Firm* — Wells St. John P.S.

(57) ABSTRACT

A programmable charge-storage transistor comprises channel material, insulative charge-passage material, charge-storage material, a control gate, and charge-blocking material between the charge-storage material and the control gate. The charge-blocking material comprises a non-ferroelectric insulator material and a ferroelectric insulator material. Arrays of elevationally-extending strings of memory cells of memory cells are disclosed, including methods of forming such. Other embodiments, including method, are disclosed.

3 Claims, 11 Drawing Sheets

(51) Int. Cl.
  *H01L 29/51* (2006.01)
  *H01L 27/11556* (2017.01)
  *H01L 27/11582* (2017.01)
  *H01L 21/28* (2006.01)
  *H01L 27/11597* (2017.01)
  *H01L 29/792* (2006.01)
  *H01L 27/1157* (2017.01)
  *H01L 27/1159* (2017.01)
  *H01L 29/66* (2006.01)

(52) U.S. Cl.
  CPC .. *H01L 27/11556* (2013.01); *H01L 27/11582* (2013.01); *H01L 27/11597* (2013.01); *H01L 29/40111* (2019.08); *H01L 29/40117* (2019.08); *H01L 29/4234* (2013.01); *H01L 29/42324* (2013.01); *H01L 29/512* (2013.01); *H01L 29/513* (2013.01); *H01L 29/516* (2013.01); *H01L 29/6684* (2013.01); *H01L 29/66833* (2013.01); *H01L 29/7923* (2013.01)

(58) Field of Classification Search
  CPC ............ H01L 29/516; H01L 27/11556; H01L 27/11582
  See application file for complete search history.

(56) References Cited

U.S. PATENT DOCUMENTS

| | | |
|---|---|---|
| 9,716,105 B1 | 7/2017 | Tsutsumi |
| 9,911,847 B1 | 3/2018 | Chin et al. |
| 9,911,947 B2 | 3/2018 | Hong |
| 9,978,772 B1 | 5/2018 | Carlson |
| 2005/0151184 A1 | 7/2005 | Lee et al. |
| 2011/0001183 A1* | 1/2011 | Yoo ............... H01L 21/02145 257/324 |
| 2013/0087846 A1 | 4/2013 | Lee et al. |
| 2014/0175531 A1 | 6/2014 | Huang et al. |
| 2014/0264532 A1 | 9/2014 | Dennison et al. |
| 2018/0366547 A1* | 12/2018 | Liu ............... H01L 29/6684 |
| 2019/0019551 A1 | 1/2019 | Lee |
| 2019/0131458 A1 | 5/2019 | Yoo |
| 2019/0198638 A1 | 6/2019 | Van Houdt et al. |

OTHER PUBLICATIONS

Yeung et al. "Low Power Negative Capacitance FETs for Furture Quantum-Well Body Technology", IEEE, 2013 International Symposium on VLSI Technolgy, Systems, and Applications, Apr. 22-24, 2013, United States, 2 pages.

Muller, et al., "Ferroelectricity in simple binary ZrO2 and HfO2, Supplementary Information", available online at: pstorage-acs-6854636.s3.amazonaws.com/4141051/nl302049k_si_001.pdf, 6 pages.

Xu et al., "Ferroelectric HfZrOx-based MoS2 negative capacitance transisitor with ITO capping layers for steep-slope device application", Applied Physics Letter vol. 112, 2018, United States, 5 pages.

Zhou et al., "Ferroelectric HfZrOx Ge and GeSn PMOSFETs with Sub-60 mV/decade Subthreshold Swing, Negligible Hysteresis, and Improved IDS", IEEE, 2016, United States, 4 pages.

\* cited by examiner

PROGRAMMABLE CHARGE-STORAGE TRANSISTOR, AN ARRAY OF ELEVATIONALLY-EXTENDING STRINGS OF MEMORY CELLS, AND A METHOD OF FORMING AN ARRAY OF ELEVATIONALLY-EXTENDING STRINGS OF MEMORY CELLS

TECHNICAL FIELD

Embodiments disclosed herein pertain to programmable charge-storage transistors, to arrays of elevationally-extending strings of memory cells, and to methods of forming an array of elevationally-extending strings of memory cells.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor.

Charge-storage regions of programmable field effect transistors are programmed (written to by storing charge therein) and erased (removing the stored charge) by applying suitable respective program and erase voltages at least to the conductive gate. Higher programming and erase voltages are desired as such may provide more assurance that the desired effect (i.e., program or erase) is achieved as compared to lower voltages, and which may reduce time to program and/or erase.

DETAILED DESCRIPTION OF EXAMPLE EMBODIMENTS

Figure 1:
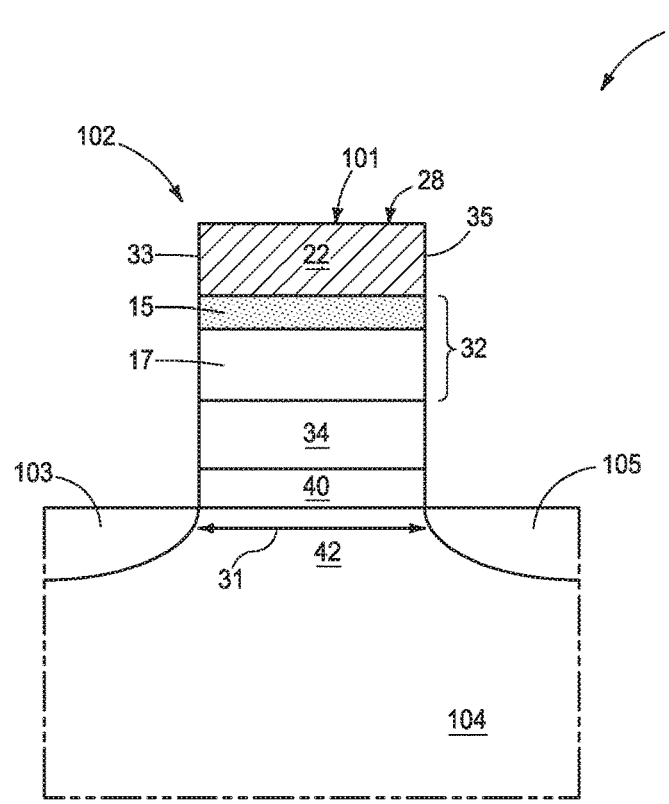
FIG. 1 is a diagrammatic cross-sectional view of a programmable charge-storage transistor in accordance with an embodiment of the invention.

Embodiments of the invention encompass programmable charge-storage transistors, arrays of elevationally-extending strings of memory cells, and methods of forming an array of elevationally-extending strings of memory cells. A first example embodiment is shown in FIG. 1, which comprises a substrate or substrate fragment 100 having a base substrate 104 within and over which a programmable charge-storage transistor 102 is shown. Base substrate 104 may comprise a semiconductor substrate. In this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 104 would, by way of example, be part of a larger substrate, for example a semiconductor wafer.

Transistor 102 comprises an example gate construction 101, example channel material 42, and example source/drain regions 103 and 105. Regions 103 and 105 and material 42 may comprise semiconductor material (e.g., silicon) having suitable conductivity-type and concentration of conductivity-modifying impurities therein to enable current to flow along example straight-line direction 31 of current flow in channel material 42 based upon selected operation of transistor gate construction 101. As examples, source/drain regions 103, 105 may be suitably conductively doped with conductivity-increasing dopant of one type and channel material 42 may doped to a lesser concentration with an impurity of another conductivity type. Additional regions may be included (not shown), for example LDD and/or halo regions.

Transistor gate construction 101 comprises insulative charge-passage material 40 (e.g., a bandgap-engineered structure having nitrogen-containing material such as silicon nitride sandwiched between two insulating oxides such as silicon dioxide), charge-storage material 34 (e.g., floating gate material such as doped or undoped silicon, or charge-trapping material such as silicon nitride, metal dots, etc.), a control gate 28 (e.g., comprising conductive control-gate material 22 such as elemental metals, metal material, and conductively-doped-semiconductive materials, including mixtures thereof), and charge-blocking material 32 between charge-storage material 34 and control gate 28. Charge-blocking material 32 comprises a non-ferroelectric insulator material 17 and a ferroelectric insulator material 15. In one embodiment and as shown, ferroelectric insulator material 15 and non-ferroelectric insulator material 17 are directly against one another, and in one embodiment ferroelectric insulator material 15 is thinner than non-ferroelectric insulator material 17. Regardless, an example thickness for ferroelectric insulator material 15 is 10 to 100 Angstroms, with 20 to 50 Angstroms being ideal. Example thicknesses for each of materials 40, 34 17, and 22 are 30 to 250 Angstroms. Example non-ferroelectric insulator materials are silicon dioxide and/or silicon nitride (e.g., silicon nitride sandwiched between two layers of silicon dioxide). Example ferroelectric insulators include metal oxide-comprising materials comprising one or more of transition metal oxide, zirconium, zirconium oxide, hafnium, hafnium oxide, lead zirconium titanate, tantalum oxide, strontium oxide, strontium titanium oxide, titanium oxide, and barium strontium titanate, and which may have dopant therein which comprises one or more of silicon, aluminum, lanthanum, yttrium, erbium, calcium, magnesium, strontium, lutetium, dysprosium, gadolinium, praseodymium, chromium, niobium, tantalum, hafnium, zirconium, vanadium manganese, cobalt, nickel, carbon and any other rare earth element. One particular example is a hafnium and zirconium based oxide having suitable dopant therein. Other examples include a hafnium and silicon based oxide having suitable dopant therein; a yttrium and zirconium based oxide having suitable dopant therein; and a hafnium, silicon, and zirconium based oxide.

In one embodiment, non-ferroelectric insulator material 17 is closer to charge-storage material 34 than is ferroelectric insulator material 15, in one embodiment ferroelectric insulator material 15 is directly against control gate 28, and in one embodiment non-ferroelectric insulator material 17 is directly against charge-storage material 34. Any other attribute(s) or aspect(s) as shown and/or described herein with respect to other embodiments may be used.

Figure 2:
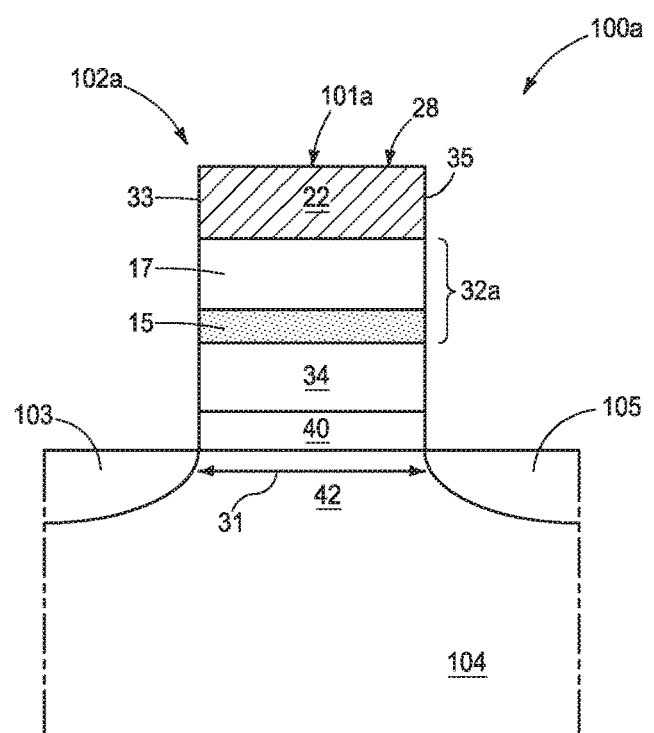
FIG. 2 is a diagrammatic cross-sectional view of a programmable charge-storage transistor in accordance with an embodiment of the invention.

FIG. 2 shows an alternate example programmable charge-storage transistor 102a of a substrate 100a comprising a gate construction 101a having charge-blocking material 32a. Like numerals from the above-described embodiments have been used where appropriate, with some construction differences being indicated with the suffix "a". In construction 101a, and in one embodiment, ferroelectric insulator material 15 is closer to charge-storage material 34 than is non-ferroelectric insulator material 17, in one embodiment non-ferroelectric insulator material 17 is directly against control gate 28, and in one embodiment ferroelectric insulator material 15 is directly against charge-storage material 34. Any other attribute(s) or aspect(s) as shown and/or described herein with respect to other embodiments may be used.

Figure 3:
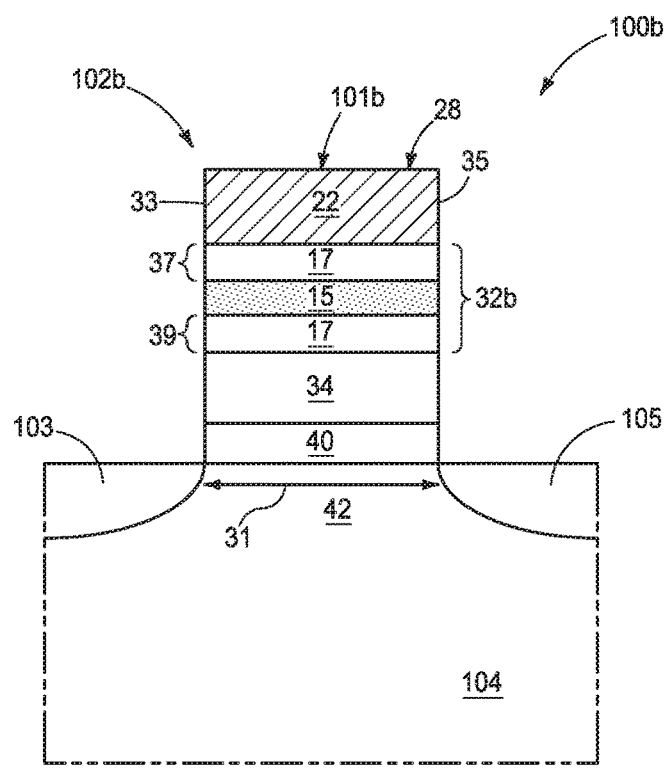
FIG. 3 is a diagrammatic cross-sectional view of a programmable charge-storage transistor in accordance with an embodiment of the invention.

FIG. 3 shows an alternate example programmable charge-storage transistor 102b of a substrate 100b comprising a gate construction 101b having charge-blocking material 32b. Like numerals from the above-described embodiments have been used where appropriate, with some construction differences being indicated with the suffix "b" or with different numerals. Ferroelectric insulator material 15 in charge-blocking material 32b is sandwiched between two regions 37, 39 of non-ferroelectric insulator material 17 along a direction that is parallel straight-line direction 31 of current flow in channel material 42. Example thicknesses for each of regions 37, 39 and material 15 is 10 to 100 Angstroms. In one embodiment and as shown, ferroelectric insulator material 15 is directly against non-ferroelectric insulator material 17 of each of two regions 37, 39. Any other attribute(s) or aspect(s) as shown and/or described herein with respect to other embodiments may be used.

Figure 4:
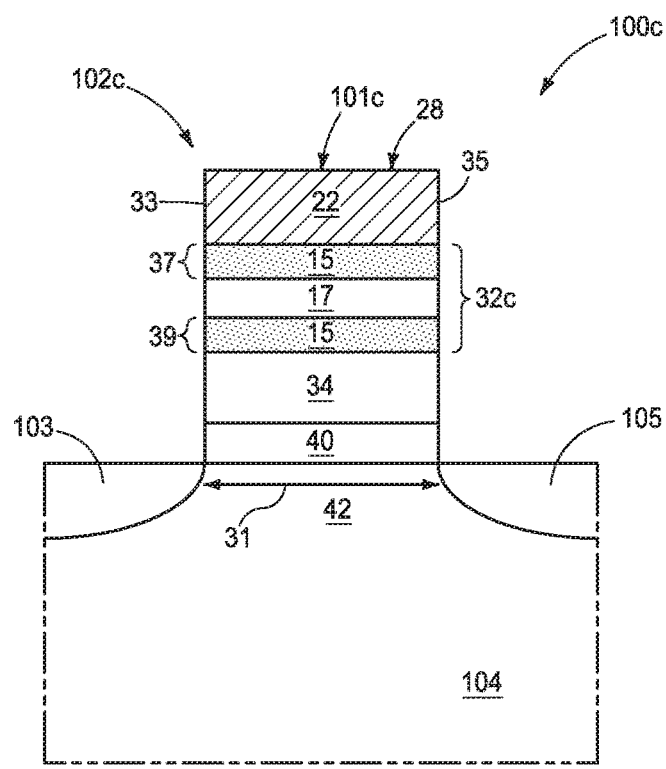
FIG. 4 is a diagrammatic cross-sectional view of a programmable charge-storage transistor in accordance with an embodiment of the invention.

FIG. 4 shows an alternate example programmable charge-storage transistor 102c of a substrate 100c comprising a gate construction 101c having charge-blocking material 32c. Like numerals from the above-described embodiments have been used where appropriate, with some construction differences being indicated with the suffix "c". Non-ferroelectric insulator material 17 of charge-blocking material 32c is sandwiched between two regions 37, 39 of ferroelectric insulator material 15 along a direction that is parallel straight-line direction 31 of current flow in channel material 42. In one embodiment and as shown, non-ferroelectric insulator material 17 is directly against ferroelectric insulator material 15 in each of two regions 37, 39. Any other attribute(s) or aspect(s) as shown and/or described herein with respect to other embodiments may be used.

Figure 5:
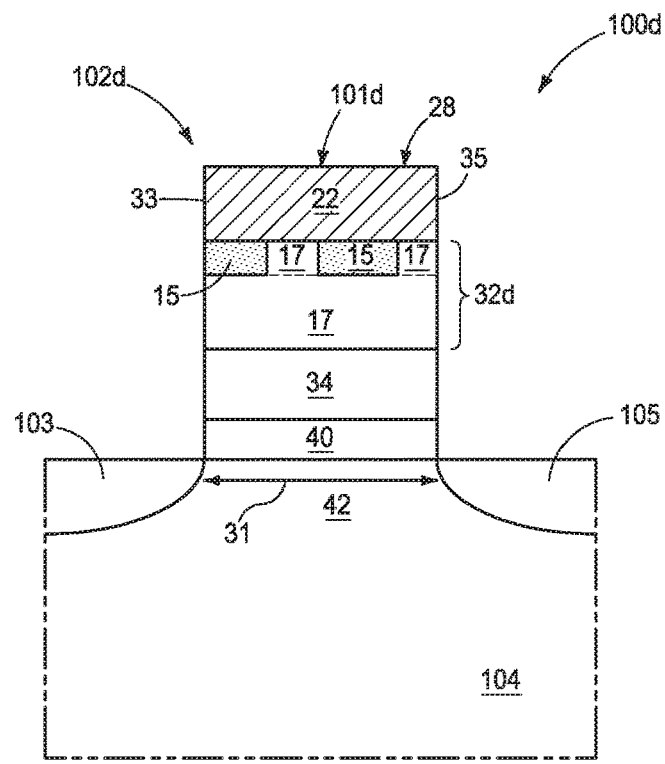
FIG. 5 is a diagrammatic cross-sectional view of a programmable charge-storage transistor in accordance with an embodiment of the invention.

FIGS. 1-4 show example embodiments wherein ferroelectric insulator material 15 is continuous between edges 33, 35 of control gate 28 parallel straight-line direction 31 of current flow in channel material 42. Alternately, such ferroelectric insulator material may be discontinuous between those edges. Such an example embodiment is shown in FIG. 5 with respect to a programmable charge-storage transistor 102d of a substrate 100d comprising a gate construction 101d having charge-blocking material 32d. Like numerals from the above-described embodiments have been used where appropriate, with some construction differences being indicated with the suffix "d". Charge-blocking material 32d is shown with ferroelectric insulator material 15 being discontinuous between edges 33, 35 of control gate 28 parallel straight-line direction 31 of current flow in channel material 42. Only two example spaced segments of ferroelectric insulator material 15 are shown, although more may be formed and variously positioned. In one embodiment and as shown, non-ferroelectric insulator material 17 is laterally between the discontinuous segments of ferroelectric insulator material 15. Any other attribute(s) or aspect(s) as shown and/or described herein with respect to other embodiments may be used.

Figure 6:
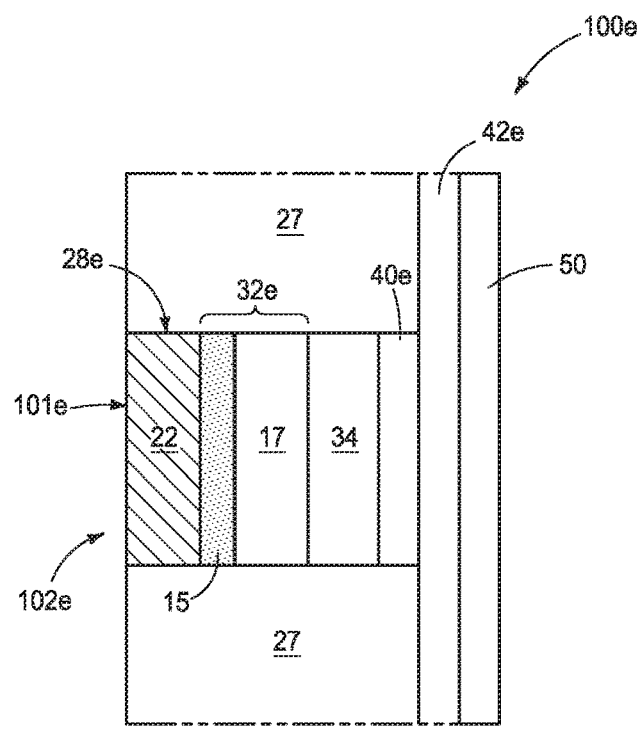
FIG. 6 is a diagrammatic cross-sectional view of a programmable charge-storage transistor in accordance with an embodiment of the invention.

FIGS. 1-5 show examples wherein transistor 102/102a/102b/102c/102d is horizontal or within 10° of horizontal. Alternately, a programmable charge-storage transistor may be fabricated to be elevationally-extending or other than elevationally-extending. FIG. 6 shows an example programmable charge-storage transistor 102e of a substrate 100e that extends elevationally, with the particularly depicted embodiment transistor 102e being vertical or within 10° of vertical. Like numerals from the above-described embodiments have been used where appropriate, with some construction differences being indicated with the suffix "e" or with different numerals. Channel material 42e in the example embodiment of FIG. 6 is shown as being sandwiched between insulative charge-passage material 40e and a backing dielectric material 50 (e.g., silicon dioxide and/or silicon nitride). Source/drain regions are not specifically shown in FIG. 6, for example as might occur with respect to an elevationally-extending string of memory cells wherein source/drain regions are provided at a top and a bottom of a stack of such memory cells, for example as will be described below. Dielectric material 27 (e.g., silicon dioxide and/or silicon nitride) is above and below gate construction 101e. Any other attribute(s) or aspect(s) as shown and/or described herein with respect to other embodiments may be used.

Figure 7:
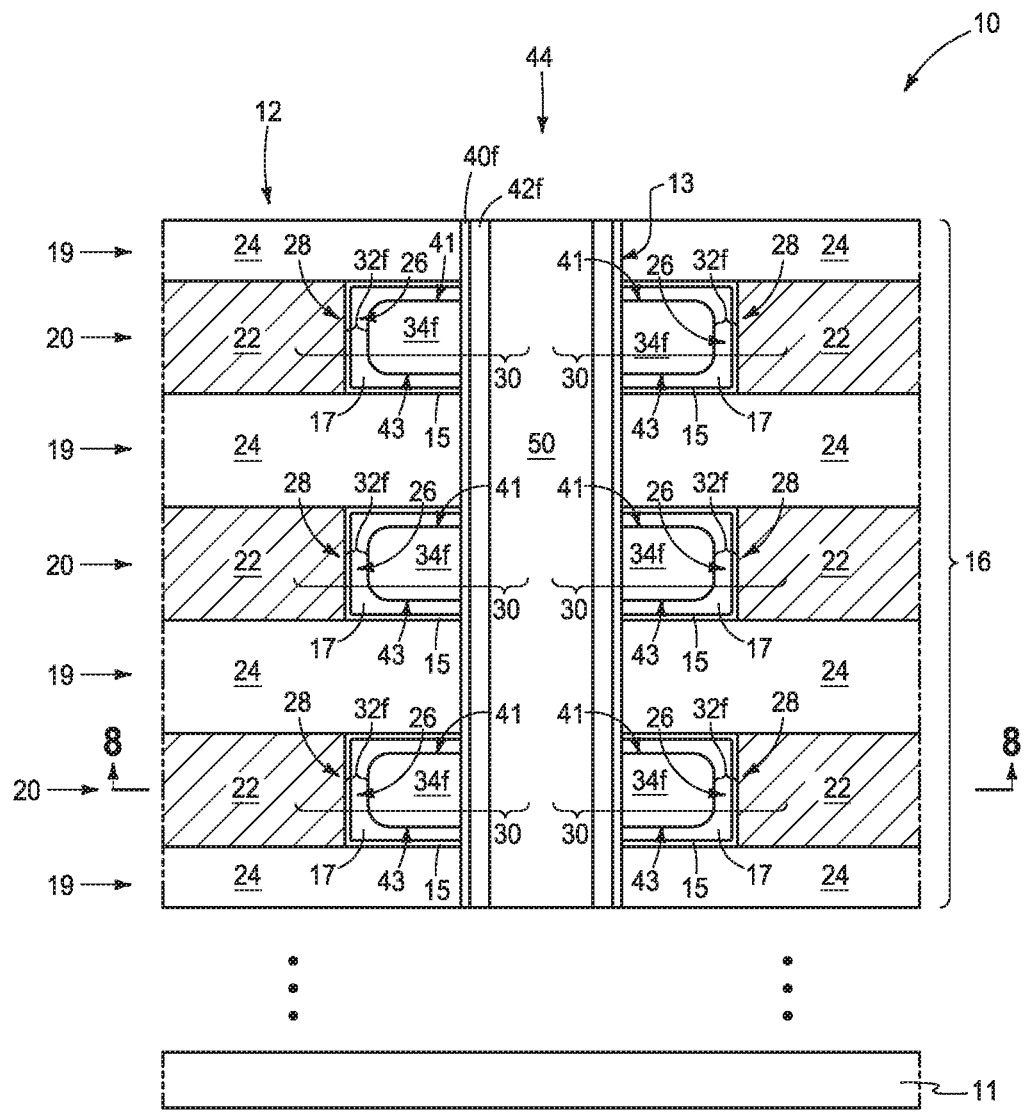
FIG. 7 is a diagrammatic cross-sectional view of a portion of an array of elevationally-extending strings of memory cells in accordance with an embodiment of the invention.
Figure 8:
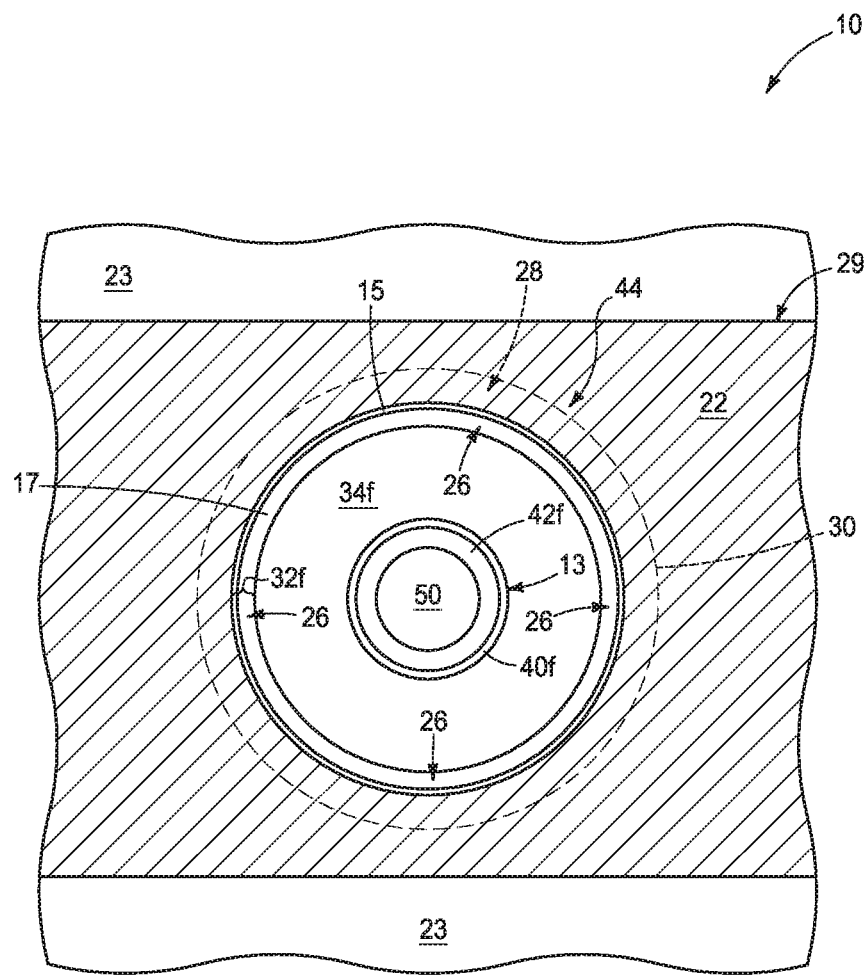
FIG. 8 is a view taken through line 8-8 in FIG. 7.

An embodiment of the invention comprises an array of elevationally-extending strings of memory cells, for example as shown in FIGS. 7 and 8. Like numerals from the above-described embodiments have been used where appropriate, with some construction differences being indicated with the suffix "f" or with different numerals. A construction 10 comprises a base substrate 11 that may include any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 7 and 8-depicted materials. For example, other partially or wholly fabricated components of integrated circuitry may be provided somewhere above, about, or within base substrate 11. Control and/or other peripheral circuitry for operating components within an array of elevationally-extending strings of memory cells may also be fabricated, and may or may not be wholly or partially within such an array or sub-array. Further, multiple sub-arrays may also be fabricated and operated independently, in tandem, or otherwise relative one another. In this document, a "sub-array" may also be considered as an array.

Construction 10 comprises an array 12 of elevationally-extending strings 44 of memory cells 30. Only a single string 44 is shown, although likely hundreds, thousands, tens of thousands, etc. of such strings will be in array 12. Approximate locations of memory cells 30 are indicated with brackets in FIG. 7 and with a dashed outline in FIG. 8, with memory cells 30 being essentially ring-like or annular in the depicted example. Array 12 comprises a vertical stack 16 of alternating insulative tiers 19 and wordline tiers 20. Example tiers 20 comprise conductive control-gate material 22 having terminal ends 26 corresponding to control-gate regions 28 of individual memory cells 30. Control-gate regions 28 may be part of individual control-gate lines 29 (only one being shown and numerically designated in FIG. 8) that interconnect multiple memory cells of multiple strings of memory cells within individual wordline tiers 20 in a row direction. Dielectric material 23 (FIG. 8; e.g., silicon dioxide and/or silicon nitride) is laterally between control-gate lines 29. Array 12 is shown as having seven vertically-alternating tiers 19, 20 in FIG. 7, although fewer or likely many more (e.g., dozens, hundreds etc.) may be formed. Accordingly, more tiers 19 and 20 may be above and/or below the depicted tiers. Tiers 19 and 20 may be of any suitable vertical thickness(es) and may have the same or different vertical thickness(es) relative one another. As an example, tiers 19 and 20 may have respective thicknesses of about 10 nanometers (nm) to 300 nm. Channel openings 13 extend through alternating tiers 19, 20, with only one channel opening 13 being shown with respect to a single elevationally-extending string 44 of memory cells 30.

Charge-storage material 34f of individual memory cells 30 extends elevationally along individual control-gate regions 28. Charge-blocking material 32f (i.e., a charge block) extends elevationally along individual control-gate regions 28 between charge-storage material 34f and individual control-gate regions 28. Charge-blocking material 32f comprises non-ferroelectric insulator material 17 and ferroelectric insulator material 15. Transistor channel material 42f of individual memory cells 30 extends elevationally along charge-storage material 34f. Insulative charge-passage material 40f extends elevationally along charge-storage material 34f between transistor channel material 42f and charge-storage material 34f. Example memory cell string 44 is shown as comprising radially-central solid dielectric material 50 (e.g., spin-on-dielectric, silicon dioxide, and/or silicon nitride). Alternately, and by way of example only, the radially-central portion of memory cell string 44 may include void space(s) (not shown) and/or be devoid of solid material (not shown).

A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells.

Alternate existing or yet-to-be developed constructions may be used. For example, multiple memory cells may be formed about a single string in an individual wordline tier 20, for example by bifurcating the FIG. 8-depicted control-gate line 29 longitudinally down its middle (not shown) thus creating two memory cells (not shown) that may be separately controlled if such bifurcated control-gate lines are separately controllable.

Any other attribute(s) or aspect(s) as shown and/or described herein with respect to other embodiments may be used.

Figure 9:
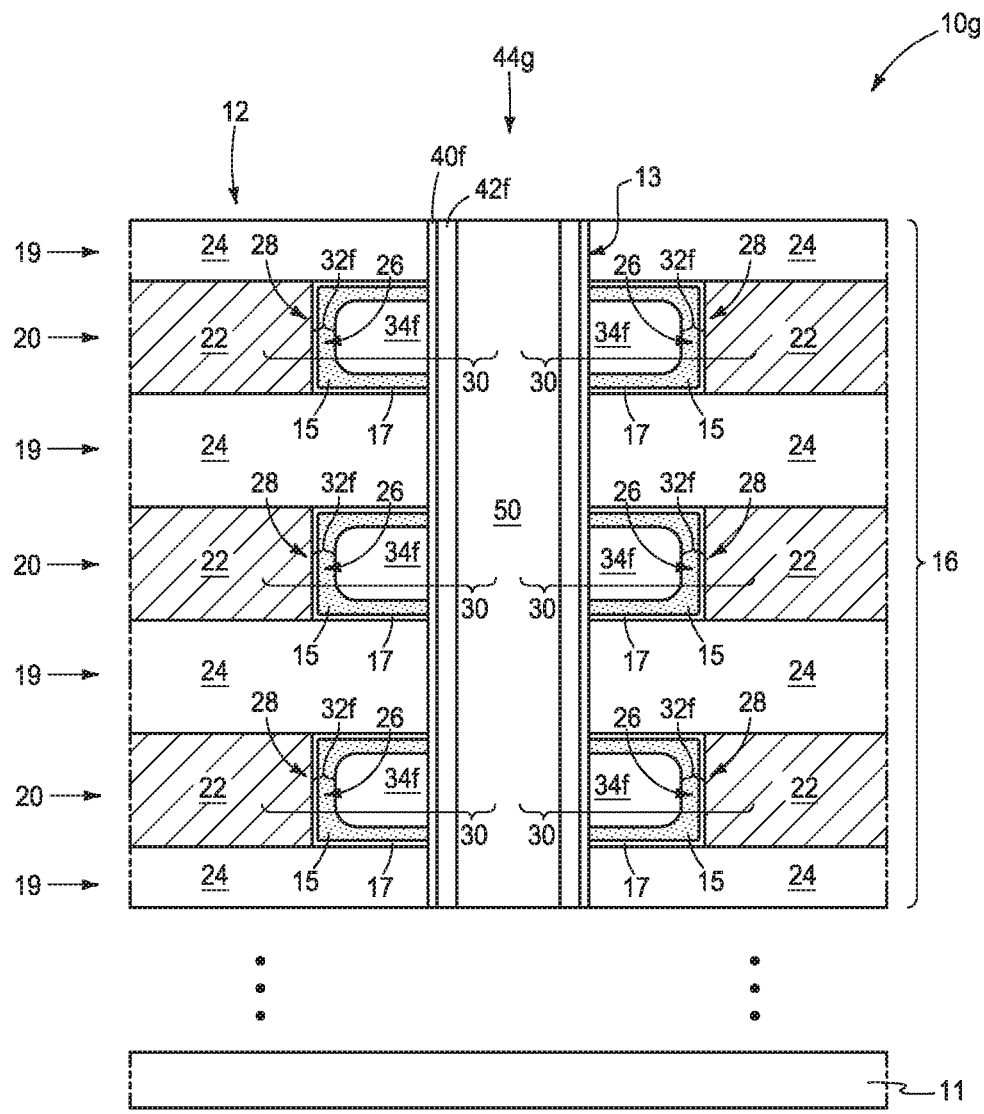
FIG. 9 is a diagrammatic cross-sectional view of a portion of an array of elevationally-extending strings of memory cells in accordance with an embodiment of the invention.

FIGS. 7 and 8 show an example embodiment wherein ferroelectric insulator material 15 and non-ferroelectric insulator material 17 are each directly above and directly below charge-storage material 34f in individual memory cells 30, and also where non-ferroelectric insulator material 17 is directly against a top 41 and a bottom 43 of charge-storage material 34f in individual memory cells 30. An alternate embodiment example elevationally-extending string 44 of memory cells 30 is shown in FIG. 9. Like numerals from the above-described embodiments have been used where appropriate, with some construction differences being indicated with the suffix "g". FIG. 9 also shows an embodiment wherein each of ferroelectric insulator material 15 and non-ferroelectric insulator material 17 is directly above and directly below charge-storage material 34f in individual memory cells 30, but wherein ferroelectric insulator material 15 is directly against tops 41 and bottoms 43 of the charge-storage material. Any other attribute(s) or aspect(s) as shown and/or described herein with respect to other embodiments may be used.

Figure 10:
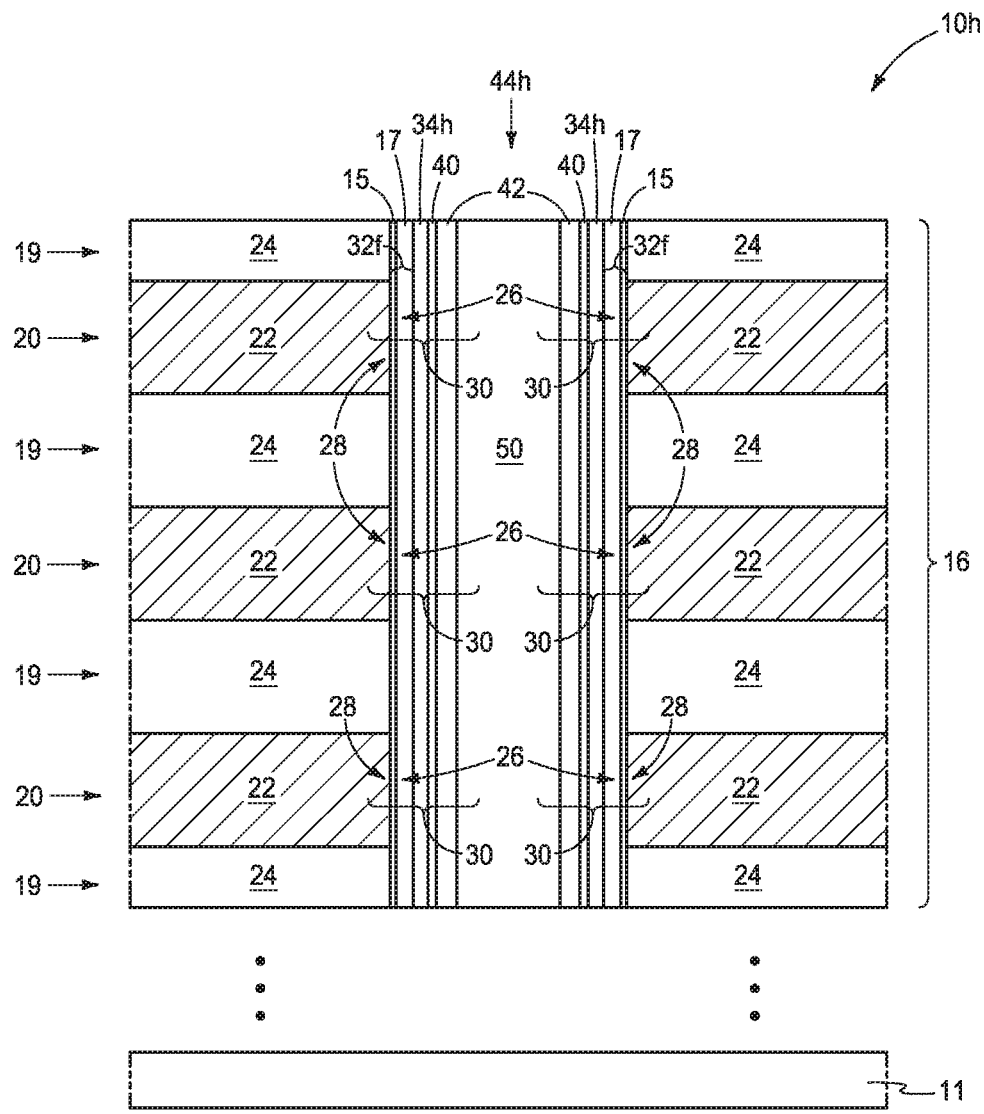
FIG. 10 is a diagrammatic cross-sectional view of a portion of an array of elevationally-extending strings of memory cells in accordance with an embodiment of the invention.

FIG. 10 shows an alternate example elevationally-extending string 44h of memory cells 30 with respect to a construction 10h. Like numerals from the above-described embodiments have been used where appropriate, with some construction differences being indicated with the suffix "h". Ferroelectric insulator material 15 is neither directly above nor directly below charge-storage material 34h in individual memory cells 30. Additionally, FIG. 10 shows an embodiment wherein non-ferroelectric insulator material 17 is neither directly above nor directly below charge-storage material 34g in individual memory cells 30. Any other attribute(s) or aspect(s) as shown and/or described herein with respect to other embodiments may be used.

Figure 11:
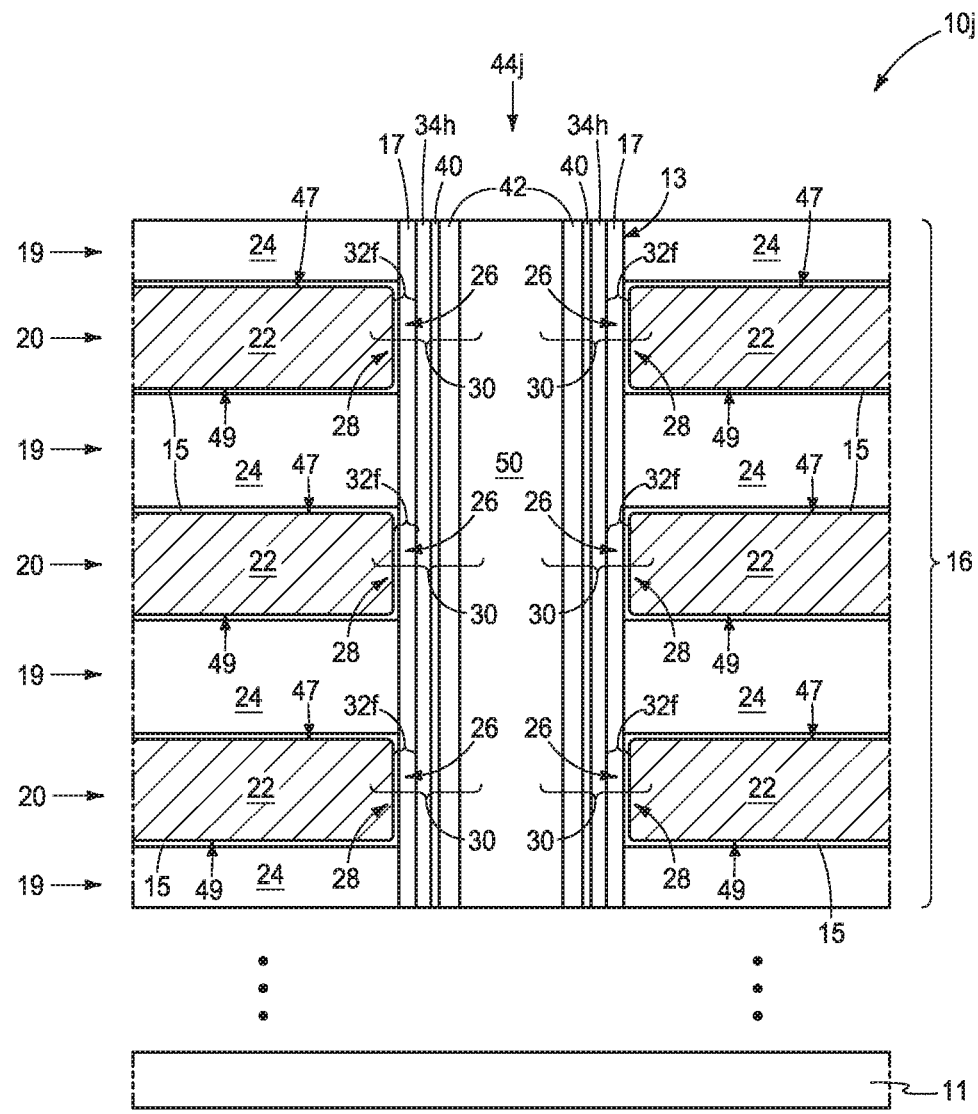
FIG. 11 is a diagrammatic cross-sectional view of a portion of an array of elevationally-extending strings of memory cells in accordance with an embodiment of the invention.

Another alternate embodiment elevationally-extending string 44j of memory cells 30 is shown in FIG. 11 with respect to a construction 10j. Like numerals from the above-described embodiments have been used where appropriate, with some construction differences being indicated with the suffix "j". Ferroelectric insulator material 15 of charge-storage material 34f is directly above and directly below control-gate material 22 in individual memory cells 30, and in one embodiment is directly against a top 47 and a bottom 49 of control-gate material 22 in individual memory cells 30. Any other attribute(s) or aspect(s) as shown and/or described herein with respect to other embodiments may be used.

Ferroelectric insulator material used as disclosed herein may exhibit negative capacitance whereby the transistor may exhibit favorable properties of low effective oxide thickness that may lead to faster programming and erase.

Figure 12:
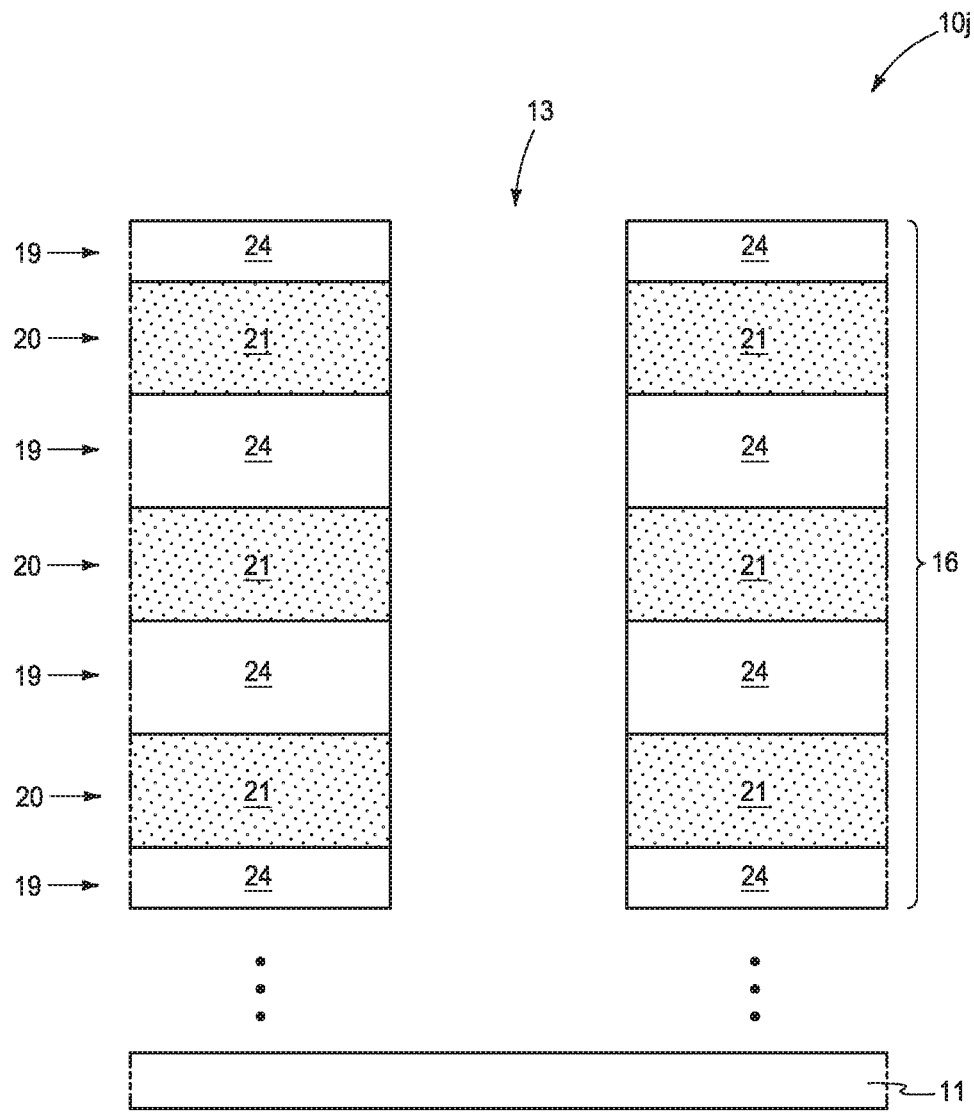
FIG. 12 is a diagrammatic cross-sectional view of a portion of a substrate in process in accordance with an embodiment of the invention.

An embodiment of the invention encompasses a method of forming an array of elevationally-extending strings of memory cells, for example as shown in the construction of FIG. 11. Such is shown and described with reference to FIGS. 12-14. Like numerals from the above-described embodiments have been used where appropriate, with like numerals being used for predecessor constructions and materials. Referring to FIG. 12, a predecessor stack 16 comprises vertically-alternating tiers 19, 20 of different composition first material 24 and second material 21. First material 24 is insulative (e.g., silicon dioxide). An example second material is silicon nitride, and which may be wholly or partially sacrificial. Elevationally-extending channel openings 13 have been formed into alternating tiers 19, 20.

Figure 13:
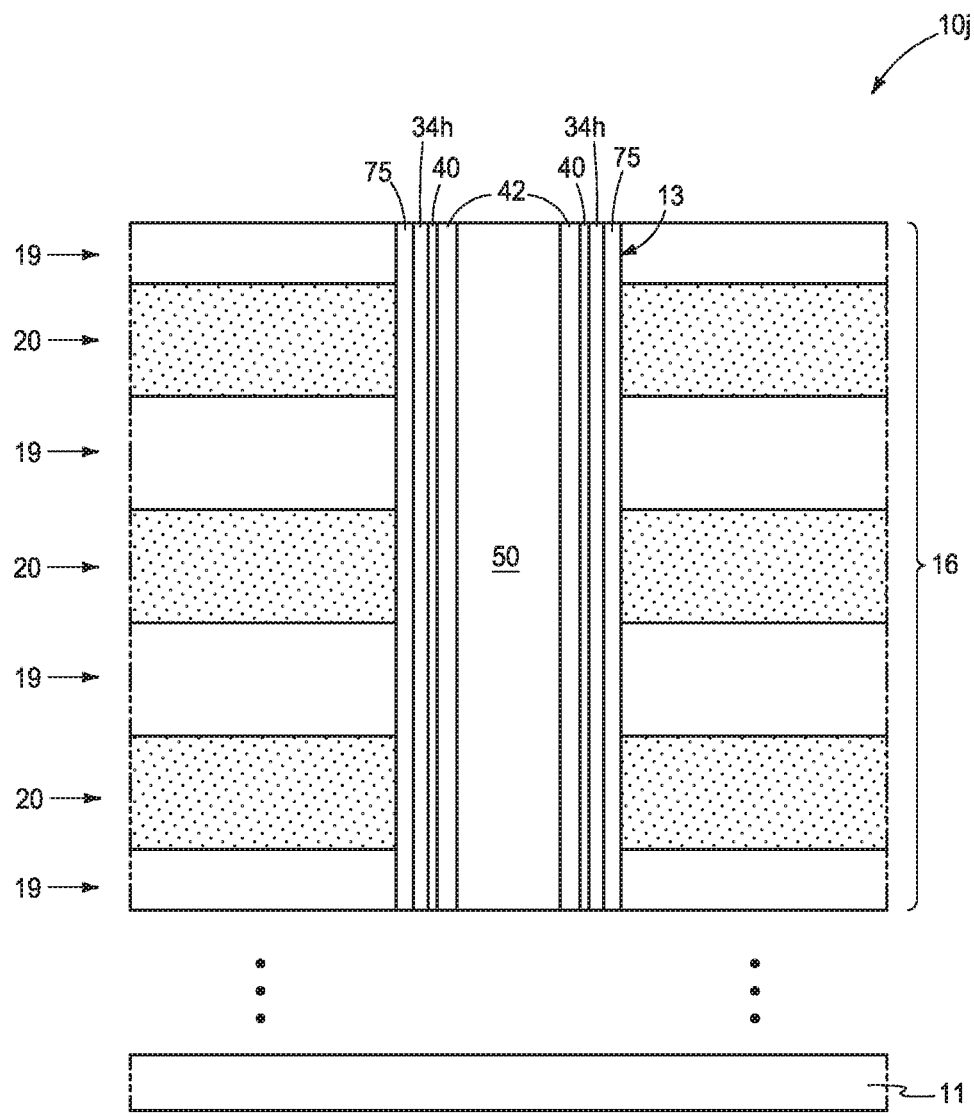
FIG. 13 is a view of the FIG. 12 substrate at a processing step subsequent to that shown by FIG. 12.

Referring to FIG. 13, first charge-blocking insulator material 75 has been formed in channel openings 13 elevationally along alternating tiers 19, 20. Charge-storage material 34h has been forming in channel openings 13 elevationally along alternating tiers 19, 20 and first charge-blocking insulator material 75. Insulative charge-passage material 40 has been formed in channel openings 13 elevationally along alternating tiers 19, 20 and charge-storage material 34h. Transistor channel material 42 has been formed in channel openings 13 elevationally along alternating tiers 19, 20 and insulative charge-passage material 40. Example radially-central dielectric material 50 has also been formed.

Figure 14:
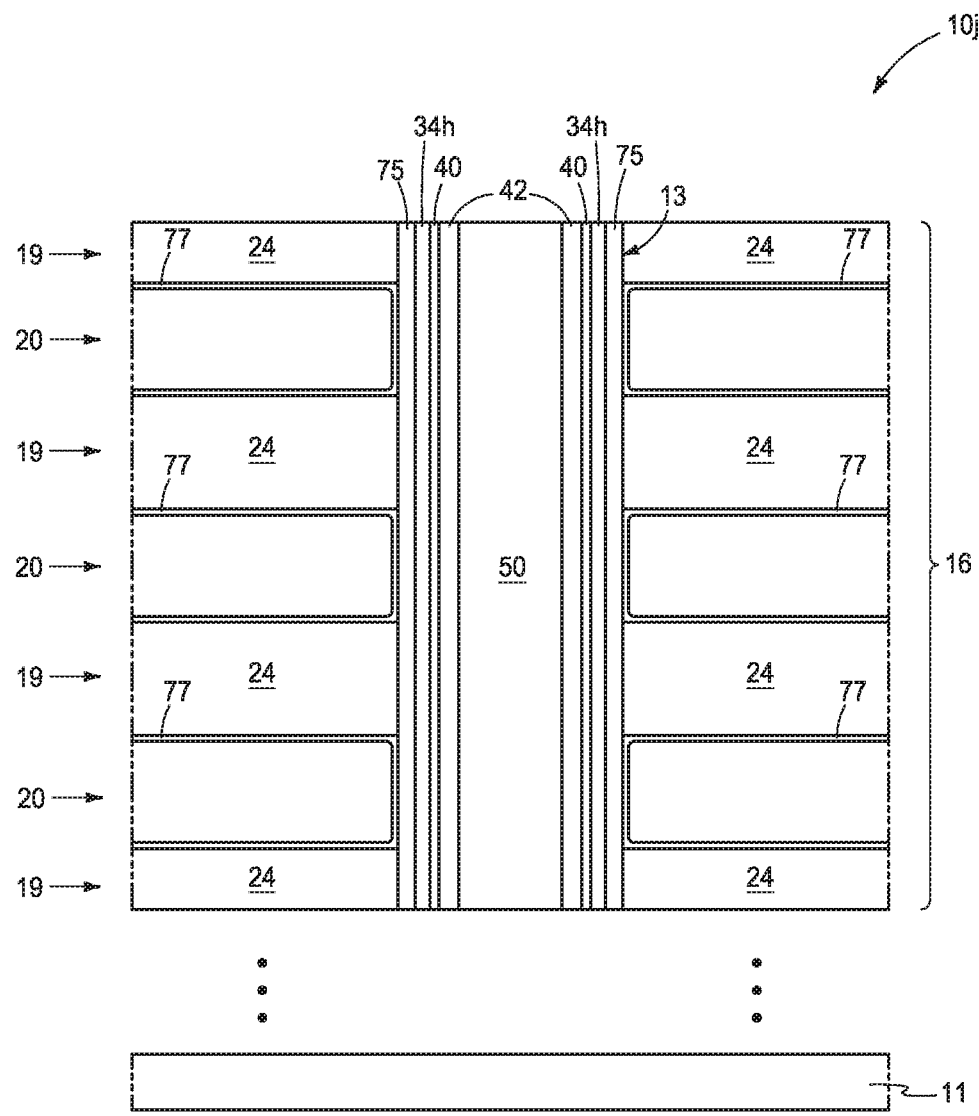
FIG. 14 is a view of the FIG. 13 substrate at a processing step subsequent to that shown by FIG. 13.

Referring to FIG. 14, at least some of second material 21 (in one embodiment all, with thereby none of second material 21 being shown in FIG. 14) has been removed from stack 16. Thereafter, second charge-blocking insulator material 77 has been formed laterally proximate first charge-blocking insulator material 75. Second charge-blocking insulator material 77 is of different composition from that of first charge-blocking insulator material 75. One of first charge-blocking insulator material 75 or second charge-blocking insulator material 77 comprises a non-ferroelectric insulator material, while the other of first charge-blocking insulator material 75 or second charge-blocking insulator material 77 comprises a ferroelectric insulator material. Examples include those described above. Subsequent processing may occur, whereby for example control-gate material 22 is formed laterally over second charge-blocking insulator material 77, with such control-gate material having terminal ends 26 corresponding to control-gate regions 28 of individual memory cells 30, for example as shown in a finished construction of FIG. 11.

In one embodiment, the first charge-blocking insulator material is formed to comprise the non-ferroelectric insulator material, and the second charge-blocking insulator material is formed to comprise the ferroelectric insulator material. In one such embodiment, the ferroelectric insulator material is directly above and directly below the control-gate material in the individual memory cells in a finished construction, and in one such embodiment the ferroelectric insulator material is directly against a top and a bottom of the control-gate material in the individual memory cells in a finished construction. In one embodiment, the first charge-blocking insulator material is formed to comprise the ferroelectric insulator material, and the second charge-blocking insulator material is formed to comprise the non-ferroelectric insulator material. In one embodiment, the second charge-blocking insulator material is formed directly against the first charge-blocking insulator material.

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a programmable charge-storage transistor comprises channel material, insulative charge-passage material, charge-storage material, a control gate, and charge-blocking material between the charge-storage material and the control gate. The charge-blocking material comprises a non-ferroelectric insulator material and a ferroelectric insulator material.

In some embodiments, a programmable charge-storage transistor comprises channel material extending vertically or within 10° of vertical, insulative charge-passage material, charge-storage material, a control gate, and charge-blocking material between the charge-storage material and the control gate. The charge-blocking material comprises a non-ferroelectric insulator material and a ferroelectric insulator material. The ferroelectric insulator material and the non-ferroelectric are directly against one another. The ferroelectric insulator material is thinner than the non-ferroelectric insulator material.

In some embodiments, an array of elevationally-extending strings of memory cells comprises a stack comprising vertically-alternating insulative tiers and wordline tiers. The wordline tiers comprises control-gate material having terminal ends corresponding to control-gate regions of individual memory cells. Charge-storage material of the individual memory cells extends elevationally along individual of the control-gate regions. Charge-blocking material of the individual memory cells extends elevationally along the individual control-gate regions between the charge-storage material and the individual control-gate regions. The charge-blocking material comprises a non-ferroelectric insulator material and a ferroelectric insulator material. Transistor channel material of the individual memory cells extends elevationally along the charge-storage material. Insulative charge-passage material extends elevationally along the charge-storage material between the transistor channel material and the charge-storage material.

In some embodiments, a method of forming an array of elevationally-extending strings of memory cells comprises forming a stack comprising vertically-alternating tiers of different composition first and second materials. The first material is insulative. Elevationally-extending channel openings are formed into the alternating tiers. First charge-blocking insulator material is formed in the channel openings elevationally along the alternating tiers. Charge-storage material is formed in the channel openings elevationally along the alternating tiers and the first charge-blocking insulator material. Insulative charge-passage material is formed in the channel openings elevationally along the alternating tiers and the charge-storage material. Transistor channel material is formed in the channel openings elevationally along the alternating tiers and the insulative charge-passage material. At least some of the second material is removed from the stack. Second charge-blocking insulator material is formed laterally proximate the first charge-blocking insulator material. The second charge-blocking insulator material is of different composition from that of the first charge-blocking insulator material. One of the first charge-blocking insulator material or the second charge-blocking insulator material comprises a non-ferroelectric insulator material. The other of the first charge-blocking insulator material or the second charge-blocking insulator material comprises a ferroelectric insulator material. Control-gate material is formed laterally over the second charge-blocking insulator material. The control-gate material has terminal ends corresponding to control-gate regions of individual memory cells.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A plurality of programmable charge-storage transistors, the transistors individually comprising:
   channel material;
   insulative charge-passage material;
   charge-storage material;
   a control gate;
   charge-blocking material between the charge-storage material and the control gate, the charge-blocking material comprising:
   a non-ferroelectric insulator material; and
   a ferroelectric insulator material; and
   a pair of source/drain regions having the channel material extending there-between, the pair of source/drain regions and the channel material defining a current flow path that extends from one edge of one of the pair of source/drain regions through the channel material to one edge of the other of the pair of source/drain regions, the ferroelectric insulator material being discontinuous parallel the current flow path in the channel material.

2. The transistors of claim 1 wherein individual of the transistors are horizontal or within 10° of horizontal, the control gate of the individual transistors having a pair of edges that are vertical in a vertical cross-section, the discontinuous ferroelectric insulator material of the individual transistors having at least one outermost vertical edge in the vertical cross-section that is not coincident with either of the vertical edges of the control gate in the vertical cross-section.

3. The transistors of claim 2 wherein the discontinuous ferroelectric insulator material of the individual transistors has only one outermost vertical edge in the vertical cross-section that is not coincident with either of the vertical edges of the control gate in the vertical cross-section.

* * * * *